United States Patent
Kobayashi

(10) Patent No.: US 6,483,192 B1
(45) Date of Patent: Nov. 19, 2002

(54) SEMICONDUCTOR DEVICE AND METHOD OF MANUFACTURING THE SAME

(75) Inventor: Heiji Kobayashi, Hyogo (JP)

(73) Assignee: Mitsubishi Denki Kabushiki Kiahsa, Tokyo (JP)

( * ) Notice: Subject to any disclaimer, the term of this patent is extended or adjusted under 35 U.S.C. 154(b) by 0 days.

(21) Appl. No.: 09/588,479

(22) Filed: Jun. 7, 2000

(30) Foreign Application Priority Data

Dec. 24, 1999 (JP) .......................................... 11-366941

(51) Int. Cl.⁷ .............................................. H01L 23/28
(52) U.S. Cl. ...................................................... 257/758
(58) Field of Search ................................ 257/758, 701, 257/516, 778, 760, 774; 438/622, 637

(56) References Cited

U.S. PATENT DOCUMENTS

| | | | | |
|---|---|---|---|---|
| 4,656,732 A | * | 4/1987 | Teng et al. ................ | 257/68 X |
| 5,106,780 A | * | 4/1992 | Higuchi et al. .......... | 438/622 X |
| 5,663,101 A | * | 9/1997 | Cronin ....................... | 438/637 |
| 5,759,911 A | * | 6/1998 | Cronin et al. ............... | 438/622 |
| 6,137,176 A | * | 10/2000 | Morozumi et al. ......... | 257/751 |
| 6,140,705 A | * | 10/2000 | Liu .............................. | 257/774 |
| 6,215,187 B1 | * | 4/2001 | Ooto et al. .................. | 257/758 |

FOREIGN PATENT DOCUMENTS

JP 8-17914 1/1996

\* cited by examiner

*Primary Examiner*—Olik Chaudhuri
*Assistant Examiner*—(Vikki) Hoa B. Trinh
(74) *Attorney, Agent, or Firm*—McDermott, Will & Emery

(57) ABSTRACT

A pad is formed on a substrate with a pad formed to approximate to the wire. Silicon oxide films are formed to cover the wire and the pad. A contact hole is formed through the silicon oxide films. A side wall oxide film is formed on the side surface and the bottom surface of the contact hole except an exposed surface of the pad. A conductive layer is formed to be electrically connected with the pad. When the contact hole is formed to overlap with the wire and the pad by misalignment or the like, the side wall oxide film electrically insulates the conductive layer and the wire from each other, thereby preventing electrical shorting and obtaining a semiconductor device attaining high integration and refinement.

8 Claims, 10 Drawing Sheets

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the same, and more particularly, it relates to a semiconductor device and a method of manufacturing the same capable of attaining high integration and refinement.

2. Description of the Prior Art

In a semiconductor device, the width of and the distance between wires are reduced in order to attain high integration and refinement. An exemplary conventional method of manufacturing a semiconductor device is now described.

As shown in FIG. 16, a silicon oxide film 102, for example, is formed on a silicon substrate 101 by CVD or the like. A wire 103 of a doped polysilicon film, for example, is formed on the silicon oxide film 102. Another silicon oxide film 104, for example, is formed on the silicon oxide film 102 by CVD or the like to cover the wire 103.

A prescribed photoresist pattern (not shown) is formed on the silicon oxide film 104. Anisotropic etching is performed on the silicon oxide films 104 and 102 through the photoresist pattern serving as a mask, thereby forming a contact hole 105 exposing the surface of the silicon substrate 101. A doped polysilicon film, for example, is formed on the silicon oxide film 104 to fill up the contact hole 105. Prescribed photolithography and working are performed on the doped polysilicon film, thereby forming a pad 106.

A silicon oxide film 107, for example, is formed on the silicon oxide film 104 by CVD or the like to cover the pad 106. A prescribed photoresist pattern (not shown) is formed on the silicon oxide film 107. Anisotropic etching is performed on the silicon oxide film 107 through the photoresist pattern serving as a mask, thereby forming a contact hole 108 exposing the surface of the pad 106.

As shown in FIG. 17, a doped polysilicon film, for example, is formed on the silicon oxide film 107 by CVD or the like to fill up the contact hole 108. Prescribed photolithography and working are performed on the doped polysilicon film, thereby forming a conductive layer 109. Thus, a semiconductor device including the pad 106 and the conductive layer 109 electrically connected with the pad 106 is formed.

However, the semiconductor device formed by the aforementioned method of manufacturing a semiconductor device has the following problems: When manufacturing the semiconductor device, the finished dimensions of the wire 103, the pad 106 etc. and the finished opening dimension of the contact hole 108 may be dispersed. Further, the photolithography steps may result in misalignment.

Particularly in the step of forming the contact hole 108 shown in FIG. 16, the contact hole 108 is so formed as to expose the surface of the pad 106 on the overall bottom surface of the contact hole 108, in order to reliably electrically connect the conductive layer 109 with the wire 103.

When the dimensions of the wire 103, the pad 106 etc. are sufficiently larger than the widths of dimensional dispersion, the contact hole 108 can be formed with allowance for the aforementioned dispersion in manufacturing.

However, the semiconductor device is required to reduce the dimensions of the pad 106, the wire 103 etc., the opening diameter of the contact hole 108 and the like in order to attain refinement and high integration. In the semiconductor device, further, the pad 106 and the wire 103 must be closer to each other.

In this case, the dimensions of the aforementioned parts are insufficient for the widths of dimensional dispersion, and a contact hole 108a is supposably formed as shown in FIG. 18 due to such dimensional dispersion or misalignment.

In other words, the contact hole 108a may be so formed as to expose the surface of the pad 106 not entirely but partially on the bottom surface thereof. In such a contact hole 108a, the surface of the wire 103 close to the conductive layer 109 may disadvantageously be exposed.

When the conductive layer 109 is formed in such a contact hole 108a, the pad 106 and the wire 103 are supposably electrically shorted through the conductive layer 109, as shown in FIG. 19. Thus, it is supposed that the dimensions of the respective parts cannot be readily reduced but refinement and high integration of the semiconductor device are hindered.

SUMMARY OF THE INVENTION

The present invention has been proposed in order to solve the aforementioned supposable problems, and an object thereof is to provide a semiconductor device readily attaining refinement and high integration by preventing electrical shorting, while another object is to provide a method of manufacturing such a semiconductor device.

A semiconductor device according to an aspect of the present invention comprises a first conductive region, a second conductive region, a first insulating film, a contact hole, a second insulating film and a third conductive region. The first conductive region is formed on the main surface of a semiconductor substrate. The second conductive region is formed on the main surface of the semiconductor substrate in proximity to the first conductive region and has an upper surface on a higher position than the upper surface of the first conductive region. The first insulating film is formed on the main surface of the semiconductor substrate to fill up the first conductive region and the second conductive region. The contact hole is formed in the first insulating film and exposes the surface of the second conductive region. The second insulating film is formed to cover the side surface and the bottom surface of the contact hole except the exposed surface of the second conductive region. The third conductive region is formed on the first insulating film including a part located in the contact hole and electrically connected with the second conductive region.

According to this structure, the second insulating film covers the side surface and the bottom surface of the contact hole except the exposed surface of the second conductive region. Thus, the second conductive region can be prevented from being electrically shorted to parts other than the third conductive region also when the dimensions of the conductive regions or the opening dimension of the contact hole is reduced. Consequently, the semiconductor device can readily attain refinement and high integration.

In particular, the second insulating film can prevent the second conductive region and the first conductive region from being electrically shorted through the third conductive region by insulating the third conductive region and the first conductive region from each other when the contact hole is formed to two-dimensionally overlap with the first conductive region and the second conductive region by misalignment.

When the contact hole is formed to two-dimensionally overlap with the first conductive region and the second conductive region, the second conductive region and the first conductive region can be prevented from being electrically shorted through the third conductive region since a part of the contact hole located downward beyond the upper surface of the second conductive region is filled up with at least the second insulating film.

When the contact hole is two-dimensionally further shifted toward the position of the first conductive region, it follows that the second insulating film and the third conductive region fill up the part of the contact hole located downward beyond the upper surface of the second conductive region. Also in this case, the second insulating film interposed between the third conductive region and the first conductive region can prevent the second conductive region and the first conductive region from being electrically shorted.

The semiconductor device preferably has a plurality of first conductive regions so that the first conductive regions are covered with a third insulating film, different in etching property from the first insulating film, formed between the first insulating film and the first conductive regions and the second conductive region is formed between adjacent first conductive regions covered with the third insulating film respectively.

In this case, the second conductive region can be formed between the adjacent first conductive regions in a self-alignment manner, thereby attaining further refinement and higher integration of the semiconductor device.

A method of manufacturing a semiconductor device according to another aspect of the present invention comprises the following steps: A first conductive region is formed on the main surface of a semiconductor substrate. A second conductive region approximating to the first conductive region and having an upper surface on a higher position than the upper surface of the first conductive region is formed on the main surface of the semiconductor substrate. A first insulating film is formed on the main surface of the semiconductor substrate to fill up the first conductive region and the second conductive region. A contact hole exposing the surface of the second conductive region is formed in the first insulating film. A second insulating film is formed to cover the bottom surface and the side surface of the contact hole including the exposed surface of the second conductive region. Etching is performed on the second insulating film thereby exposing the surface of the second conductive region and forming a side wall insulating film on the bottom surface and the side surface of the contact hole. A third conductive region electrically connected with the second conductive region is formed on the first insulating film including a part located in the contact hole.

According to this method, the side wall insulating film is formed on the side surface and the bottom surface of the contact hole except the exposed surface of the second conductive region. Thus, the second conductive region can be prevented from being electrically shorted to parts other than the third conductive region also when the dimensions of the conductive regions or the opening dimension of the contact hole is reduced. Consequently, a semiconductor device attaining refinement and high integration can be obtained.

In particular, the second conductive region and the first conductive region can be prevented from being electrically shorted through the third conductive region by insulating the third conductive region and the first conductive region from each other when the contact hole is formed to two-dimensionally overlap with the first conductive region and the second conductive region by misalignment.

When the contact hole is formed to two-dimensionally overlap with the first conductive region and the second conductive region in the step of forming the contact hole, the step of treating the second insulating film includes a step of filling up a part of the contact hole located downward beyond the upper surface of the second conductive region with at least the second insulating film, whereby the second conductive region and the first conductive region can be prevented from being electrically shorted through the third conductive region.

When the contact hole is two-dimensionally further shifted toward the position of the first conductive region, the step of treating the second insulating film preferably includes a resist forming step of filling up the part located downward beyond the upper surface of the second conductive region with resist and a step of performing anisotropic etching on the second insulating film through the resist serving as a mask thereby exposing the surface of the second conductive region while leaving the part of the side wall insulating film located downward beyond the upper surface of the second conductive region.

In this case, the resist prevents the second insulating film from etching, and it follows that the side wall insulating film and the third conductive region fill up the part of the contact hole located downward beyond the upper surface of the second conductive region. The third conductive region and the first conductive region can be prevented from being electrically shorted due to interposition of the side wall insulating film between the third conductive region and the first conductive region.

In order to form such resist, it is preferable to apply the resist onto the semiconductor substrate after forming the second insulating film and develop the applied resist thereby removing part of the applied resist between the surface thereof and the surface of the second insulating film located on the second conductive region.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
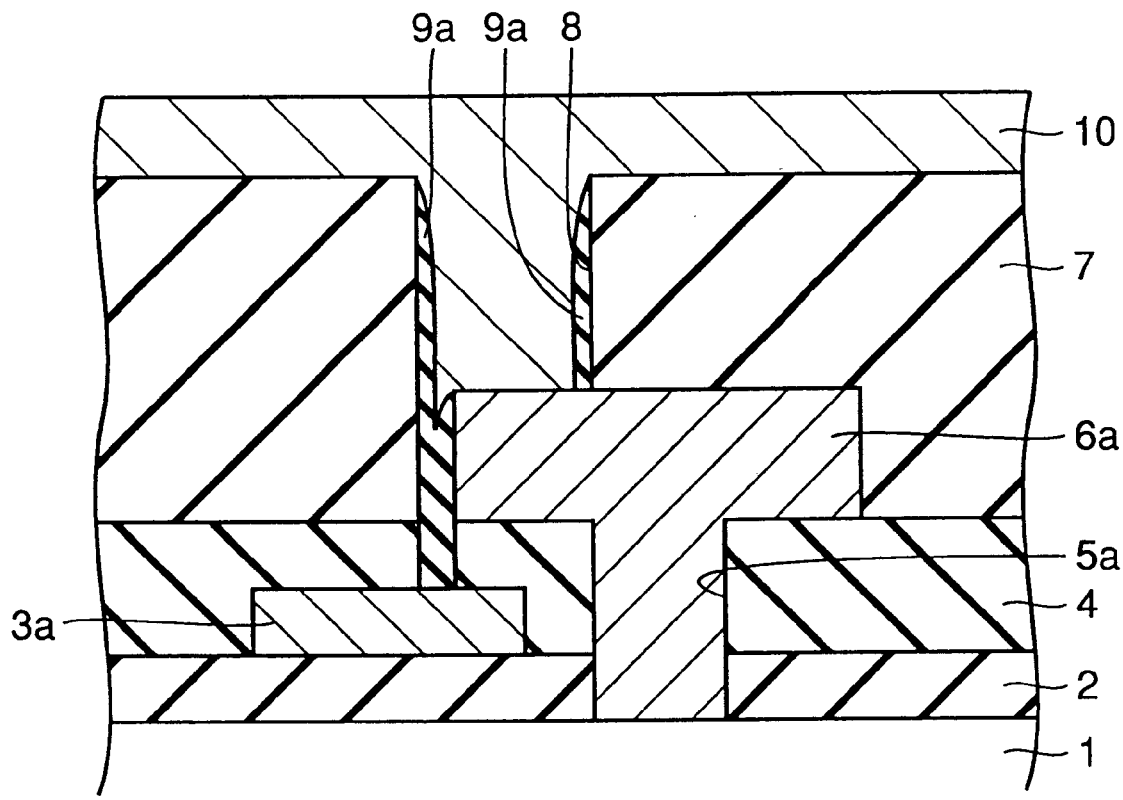
FIG. 1 is a sectional view of a semiconductor device according to a first embodiment of the present invention.

A semiconductor device and a method of manufacturing the same according to a first embodiment of the present invention are described. Referring to FIG. 1, a wire 3a of a doped polysilicon film, for example, is formed on the surface of a silicon substrate 1 through a silicon oxide film 2. Another silicon oxide film 4 is formed on the silicon oxide film 2 to cover the wire 3a.

A contact hole 5a exposing the surface of the silicon substrate 1 is formed through the silicon oxide films 4 and 2. A pad 6a of a doped polysilicon film, for example, is formed on the silicon oxide film 4 including the part located in the contact hole 5a. A silicon oxide film 7 is further formed on the silicon oxide film 4 to cover the pad 6a. A contact hole 8 is formed through the silicon oxide films 7 and 4.

The surface (upper surface) of the pad 6a is partially exposed on the bottom of the contact hole 8. In this case, the surface of the wire 3a located in the vicinity of the lower portion of the pad 6a is also exposed on the bottom of the contact hole 8.

A side wall oxide film 9a is formed on the side wall of the contact hole 8 to substantially fill up the part located downward beyond the exposed upper surface of the pad 6a. A conductive layer 10 of a doped polysilicon film, for example, electrically connected with the pad 6a is formed on the silicon oxide film 7 including the part located in the contact hole 8.

Figure 2:
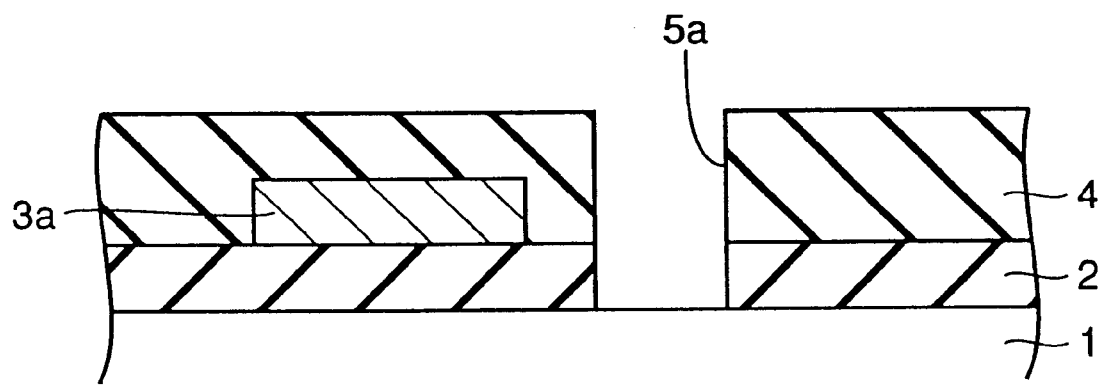
FIG. 2 is a sectional view showing a step in a method of manufacturing the semiconductor device according to the first embodiment shown in FIG. 1.

The method of manufacturing the aforementioned semiconductor device is now described. First, the silicon oxide film 2 is formed on the silicon substrate 1 by CVD, for example, as shown in FIG. 2. The wire 3a of a doped polysilicon film, for example, is formed on the silicon oxide film 2. The silicon oxide film 4 is formed on the silicon oxide film 2 by CVD, for example, to cover the wire 3a.

A prescribed photoresist pattern (not shown) is formed on the silicon oxide film 4. Anisotropic etching is performed on the silicon oxide films 4 and 2 through the photoresist pattern serving as a mask, thereby forming the contact hole 5a exposing the surface of the silicon substrate 1.

Figure 3:
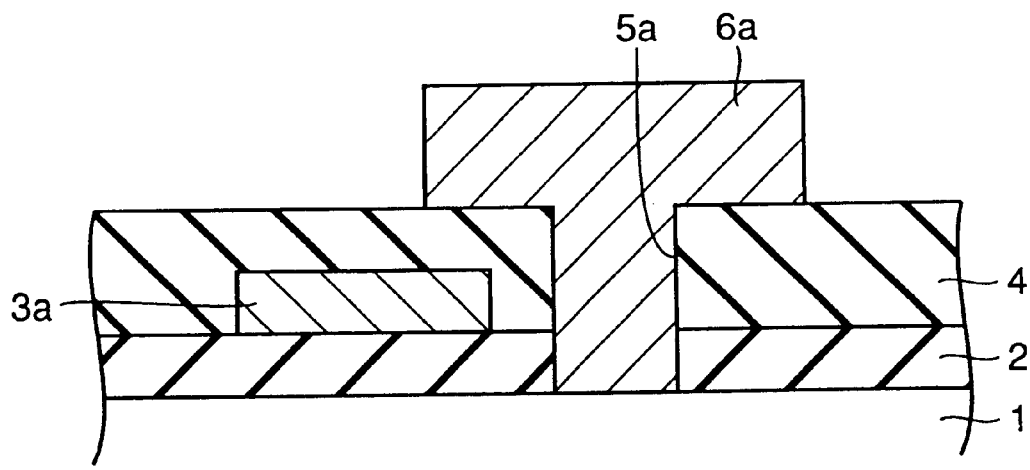
FIG. 3 is a sectional view showing a step carried out subsequently to the step shown in FIG. 2 in the first embodiment.

Then, a doped polysilicon film is formed by CVD, for example, on the silicon oxide film 4 to fill up the contact hole 5a, as shown in FIG. 3. A prescribed photoresist pattern (not shown) is formed on the doped polysilicon film. Anisotropic etching is performed on the doped polysilicon film through the photoresist pattern serving as a mask, thereby forming the pad 6a.

Figure 4:
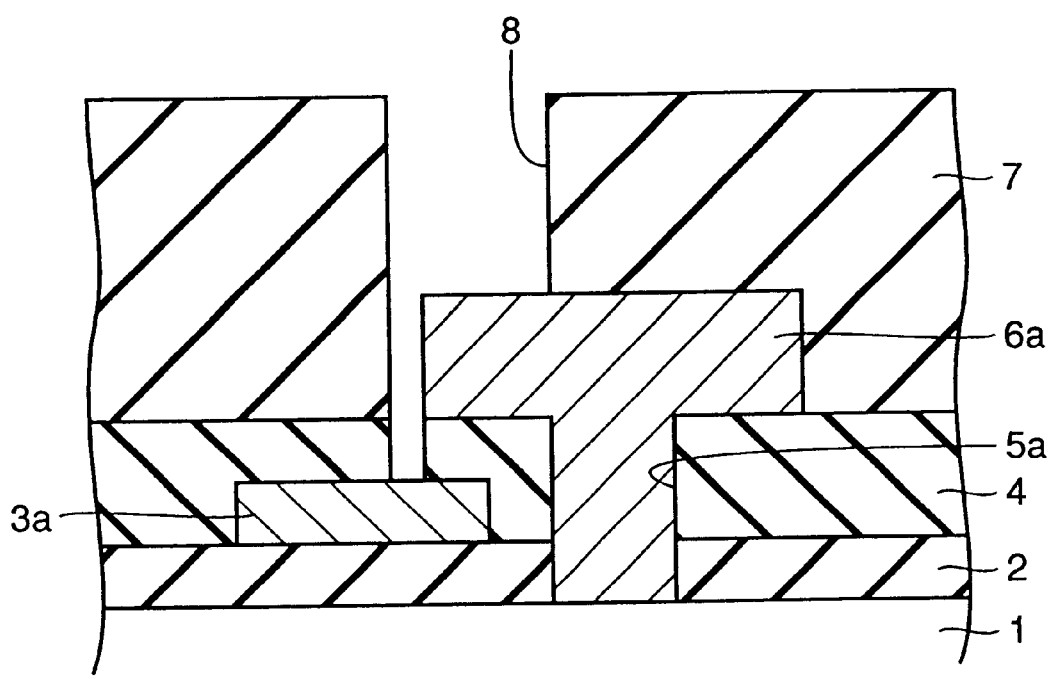
FIG. 4 is a sectional view showing a step carried out subsequently to the step shown in FIG. 3 in the first embodiment.

Then, the silicon oxide film 7 is formed on the silicon oxide film 4 by CVD or the like to cover the pad 6a, as shown in FIG. 4. A prescribed photoresist pattern (not shown) is formed on the silicon oxide film 7. Anisotropic etching is performed on the silicon oxide films 7 and 4 through the photoresist pattern serving as a mask, thereby forming the contact hole 8 exposing at least the surface of the pad 6a.

Figure 5:
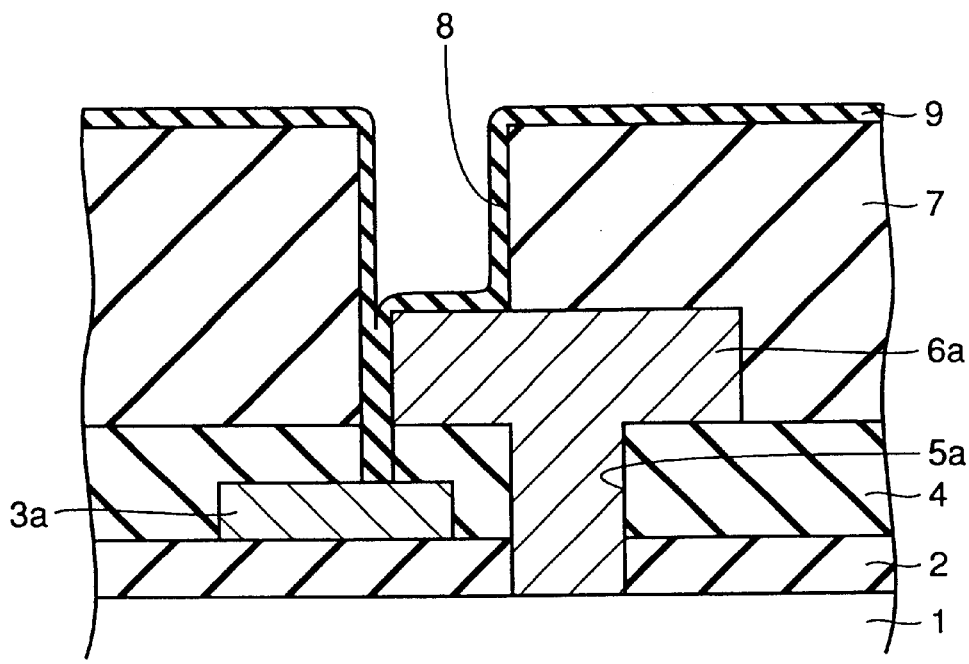
FIG. 5 is a sectional view showing a step carried out subsequently to the step shown in FIG. 4 in the first embodiment.
Figure 6:
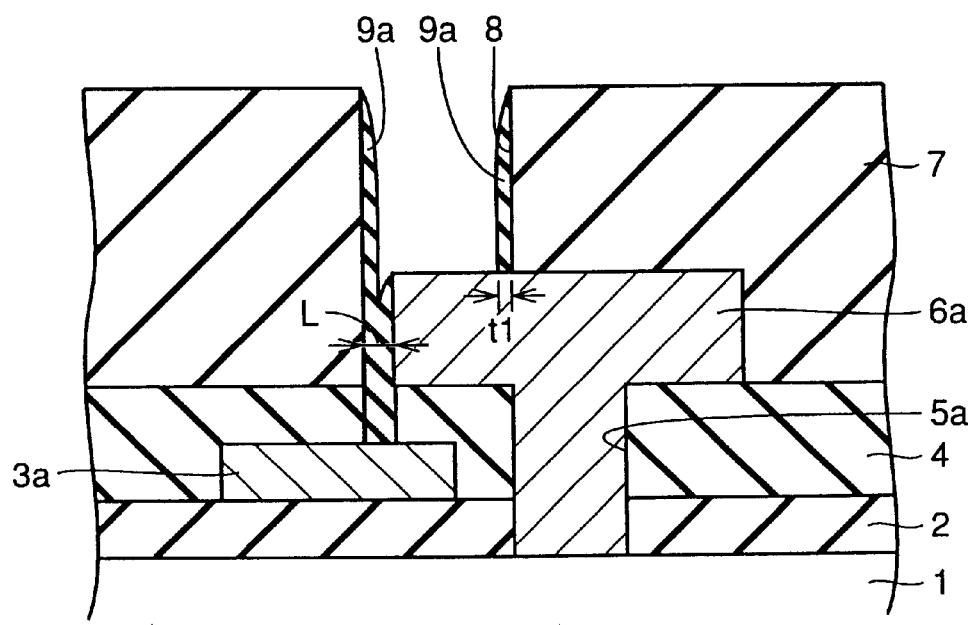
FIG. 6 is a sectional view showing a step carried out subsequently to the step shown in FIG. 5 in the first embodiment.

Then, the silicon oxide film 9 is formed on the silicon oxide film 7 by CVD or the like to cover the side surface and the bottom surface of the contact hole 8, as shown in FIG. 5. Then, anisotropic etching is performed on the silicon oxide film 9 thereby exposing the surface of the pad 6a and forming the side wall oxide film 9a on the side wall of the contact hole 8, as shown in FIG. 6.

At this time, the side wall oxide film 9a fills up the part of the contact hole 8 located downward beyond the exposed surface (upper surface) of the pad 6a, as described later.

Thereafter a doped polysilicon film is formed on the silicon oxide film 7 including the part located in the contact hole 8 by CVD or the like, for example. Prescribed photolithography and working are performed on the doped polysilicon film, thereby forming the prescribed conductive layer 10. Thus, the semiconductor device shown in FIG. 1 is completed.

When the dimensions of the wire 3a, the pad 6a etc. or the opening dimension of the contact hole 8 is reduced in order to attain refinement and high integration of the semiconductor device, the dimensions of the respective parts are insufficient for widths of dimensional dispersion or misalignment in the photolithography. Therefore, the contact hole 8 may be formed to expose the surface of the wire 3a along with the surface of the pad 6a due to misalignment as shown in FIG. 4, for example.

Also in this case, the pad 6a and the wire 3a can be prevented from being electrically shorted through the conductive layer 10 due to the side wall oxide film 9a formed on the side wall and the bottom wall of the contact hole 8 except the exposed surface of the pad 6a. Consequently, the semiconductor device can readily attain refinement and high integration.

Assuming that the contact hole 8 is about 0.2 $\mu$m in size, for example, the length L of shifting (displacement) of the contact hole 8 shown in FIG. 6 is preferably about 50 nm. In this case, the thickness of the side wall oxide film 9a is preferably about 30 nm.

When the amount L of shifting of the contact hole 8 is relatively large, the thickness $t_1$ of the side wall oxide film 9a must be increased in order to fill up the lower portion of the contact hole 8 with only the side wall oxide film 9a.

In this case, however, the opening diameter of the contact hole 8 must be increased for exposing the surface of the pad 6a. This is unpreferable in consideration of refinement.

Assuming that dmin represents the minimum diameter of the contact hole 8 openable in consideration of refinement, a represents misalignment of the pad 6a and the contact hole 8 and Dp represents the diameter of the pad 6a, the following relation is preferable:

$$Dp \leq dmin + 2a$$

In other words, the diameter Dp of the pad 6a is preferably not more than about the sum of the minimum diameter dmin of the contact hole 8 and twice 2a the misalignment.

Second Embodiment

Figure 7:
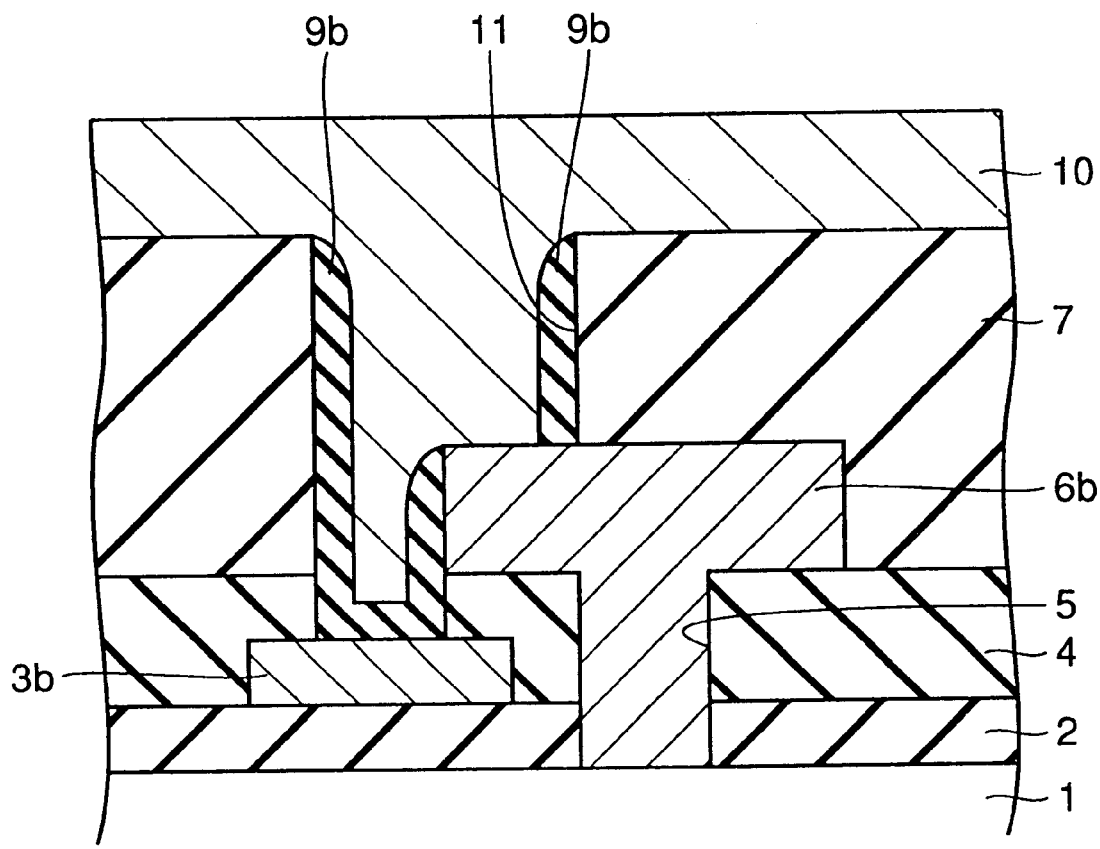
FIG. 7 is a sectional view of a semiconductor device according to a second embodiment of the present invention.

A semiconductor device and a method of manufacturing the same according to a second embodiment of the present invention are now described. In the semiconductor device according to this embodiment, a contact hole 11 is further two-dimensionally shifted toward the position of a wire 3b as compared with the semiconductor device according to the first embodiment, to overlap with the wire 3b and a pad 6b as shown in FIG. 7.

The wording "two-dimensionally overlap" indicates that the contact hole 11 is arranged to extend over the wire 3b and the pad 6b with respect to the pattern of the semiconductor device as viewed from above.

A side wall oxide film 9b is formed on the side wall of the contact hole 11 and the upper surface of the wire 3b. A conductive layer 10 is formed on a silicon oxide film 7 to fill up the contact hole 11. The remaining structure of the semiconductor device according to this embodiment is similar to that of the semiconductor device shown in FIG. 1 described with reference to the first embodiment, and hence identical members are denoted by the same reference numerals while redundant description is not repeated.

Figure 8:
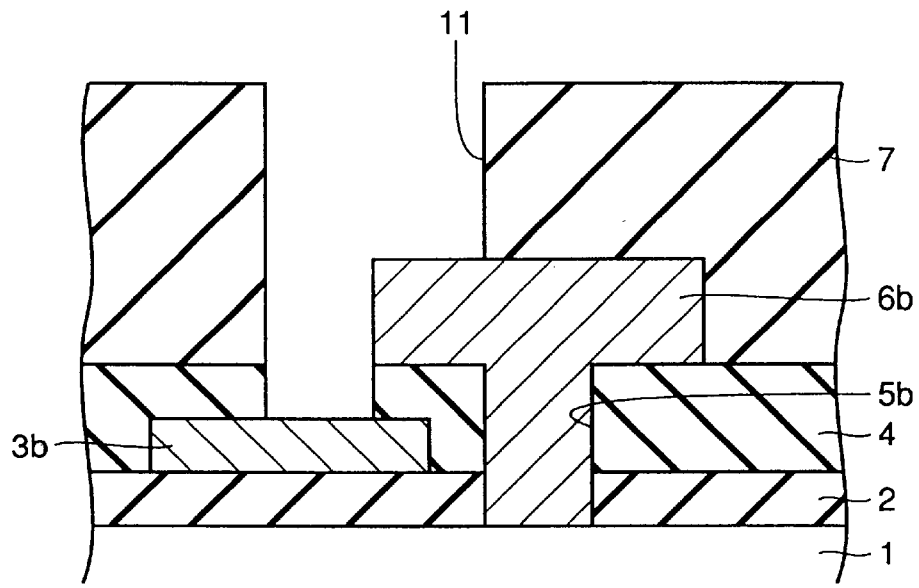
FIG. 8 is a sectional view showing a step in a method of manufacturing the semiconductor device according to the second embodiment shown in FIG. 7.

An exemplary method of manufacturing the aforementioned semiconductor device is now described. Steps up to that shown in FIG. 8 for forming the silicon oxide film 7 are identical to those described with reference to the first embodiment, and hence redundant description is not repeated. A prescribed photoresist pattern (not shown) is formed on the silicon oxide film 7. Anisotropic etching is performed on the silicon oxide film 7 and a silicon oxide film 4 through the photoresist pattern serving as a mask, thereby forming the contact hole 11 exposing the surface (upper surface) of the pad 6b.

Figure 9:
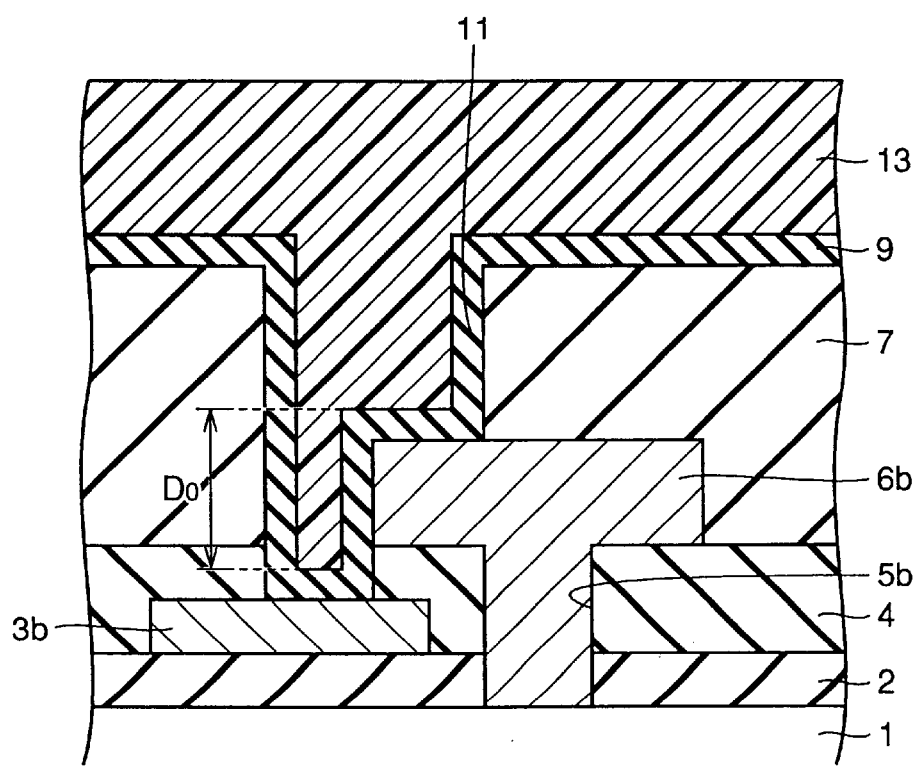
FIG. 9 is a sectional view showing a step carried out subsequently to the step shown in FIG. 8 in the second embodiment.

Then, a silicon oxide film 9 is formed on the silicon oxide film 7 including the side wall and the bottom wall of the contact hole 11 by CVD or the like, as shown in FIG. 9. A photoresist film 13 is applied to the silicon oxide film 9. Then, part of the applied photoresist film 13 is removed between the surface of the photoresist film 13 and the surface of the silicon oxide film 9 located on the upper surface of the pad 6b.

Figure 10:
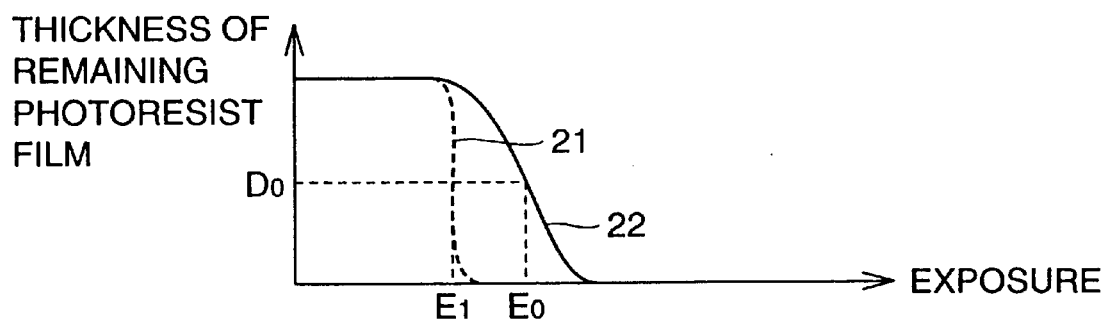
FIG. 10 illustrates the relation between the exposure and the thickness of a remaining photoresist film in the step shown in FIG. 9 in the second embodiment.
Figure 11:
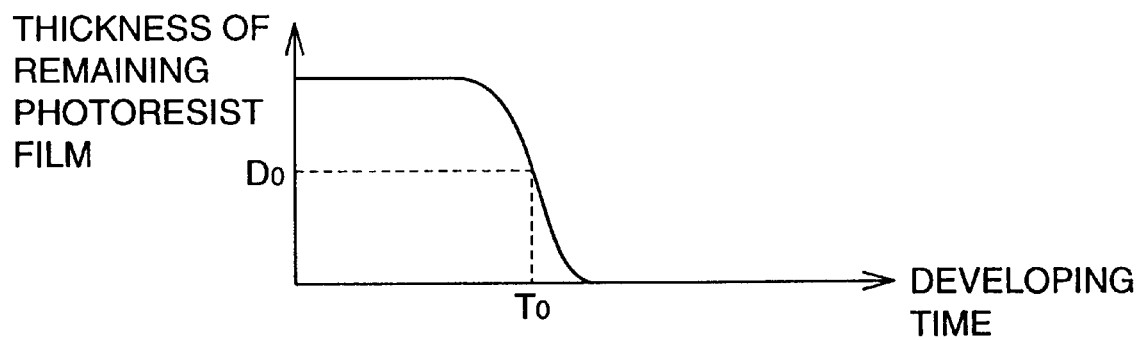
FIG. 11 illustrates the relation between the developing time and the thickness of the remaining photoresist film in the step shown in FIG. 9 according to the second embodiment.

In order to leave the photoresist film 13 by a desired thickness $D_0$, the relation between the exposure and the thickness of the remaining photoresist film 13 shown in FIG. 10 or the relation between the developing time and the thickness of the remaining photoresist film 13 shown in FIG. 11 is employed.

In other words, the exposure for leaving the photoresist film 13 in the thickness $D_0$ corresponding to the distance between the surface of the silicon oxide film 9 located on the wire 3b and the surface of the silicon oxide film 9 located on the upper surface of the pad 6b is obtained. According to the graph shown in FIG. 10, the exposure for high-resolution photoresist 21 is estimated as $E_1$. The exposure for low-resolution photoresist 22 is estimated as $E_0$. In the method according to this embodiment, the low-resolution photoresist 22 is preferably employed.

Further, the developing time for leaving the photoresist film 13 in the thickness $D_0$ is obtained. According to the graph shown in FIG. 11, the developing time is estimated as $T_0$.

Figure 12:
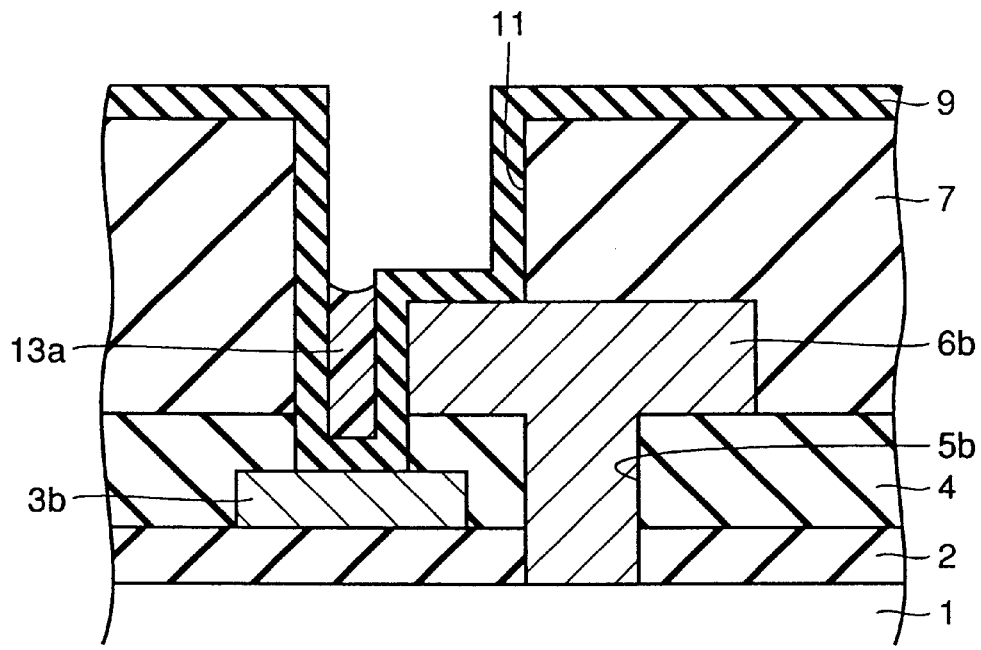
FIG. 12 is a sectional view showing a step carried out subsequently to the step shown in FIG. 9 in the second embodiment.

The photoresist film 13 is developed in the aforementioned manner, thereby forming a photoresist film 13a covering the silicon oxide film 9 located on the wire 3b, as shown in FIG. 12.

Figure 13:
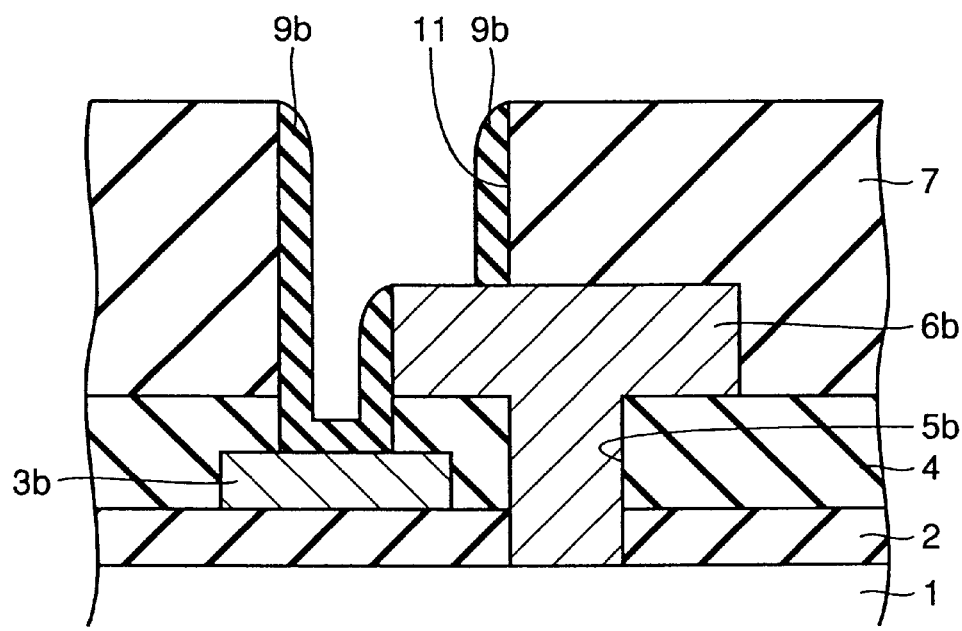
FIG. 13 is a sectional view showing a step carried out subsequently to the step shown in FIG. 12 in the second embodiment.

Then, anisotropic etching is performed on the silicon oxide film 9 through the photoresist film 13a serving as a mask thereby exposing the surface (upper surface) of the pad 6b and forming the side wall oxide film 9b on the side wall and the bottom wall of the contact hole 11, as shown in FIG. 13.

Thereafter a doped polysilicon film, for example, is formed on the silicon oxide film 7 to fill up the contact hole 11. Prescribed photolithography and working are performed on the doped polysilicon film thereby forming the conductive layer 10. Thus, the semiconductor device shown in FIG. 7 is completed.

When the dimensions of the pad 6b, the wire 3b etc. are further reduced, the contact hole 11 may be further misaligned with the pad 6b as compared with the case of the first embodiment due to misalignment in photolithography, to expose the surface of the wire 3b. In this semiconductor device, it follows that the side wall oxide film 9b and the conductive layer 10 fill up the lower portion of the contact hole 11.

Thus, in this semiconductor device, the pad 6b and the wire 3b can be prevented from being electrically shorted through the conductive layer 10 due to interposition of the side wall oxide film 9b between the wire 3b and the conductive layer 10. Thus, the semiconductor device can readily attain higher integration and further refinement.

Assuming that dmin represents the minimum diameter of the contact hole 11 openable in consideration of refinement, a represents misalignment of the contact hole 11 with respect to the pad 6b and Dp represents the diameter of the pad 6b, the following relation can be attained:

$$Dp \leq dmin + 2a$$

In other words, the diameter Dp of the pad 6b can be rendered sufficiently smaller than the sum of the minimum diameter dmin of the contact hole 11 and twice 2a the misalignment. The minimum diameter dmin of the contact hole 11 includes dimensional dispersion.

It is supposable that the semiconductor device described with reference to the first embodiment and the semiconductor device described with reference to the second embodiment are present on the same silicon substrate.

Figure 14:
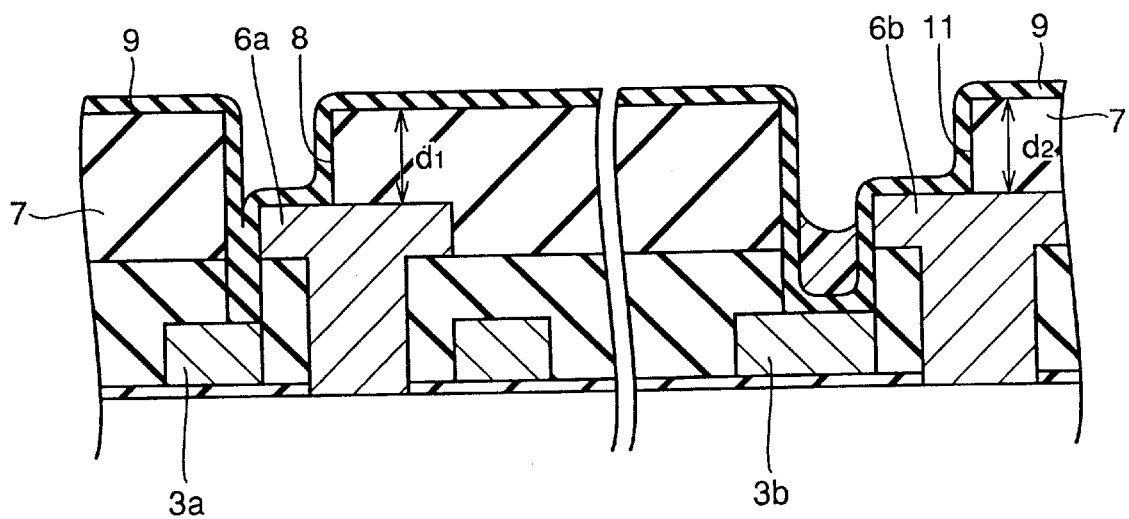
FIG. 14 is a sectional view showing a modification of the first and second embodiments.

In this case, it is conceivable that no photoresist film remains in the contact hole 8 particularly in the step of leaving the photoresist film 13a if the distance $d_1$ between the surface of the pad 6a and the surface of the silicon oxide film 7 and the distance $d_2$ between the surface of the pad 6b and the surface of the silicon oxide film 7 are substantially identical to each other as shown in FIG. 14.

If the distance $d_1$ is larger than the distance $d_2$, however, the photoresist film may remain. In this case, the remaining photoresist film must be removed.

Figure 15:
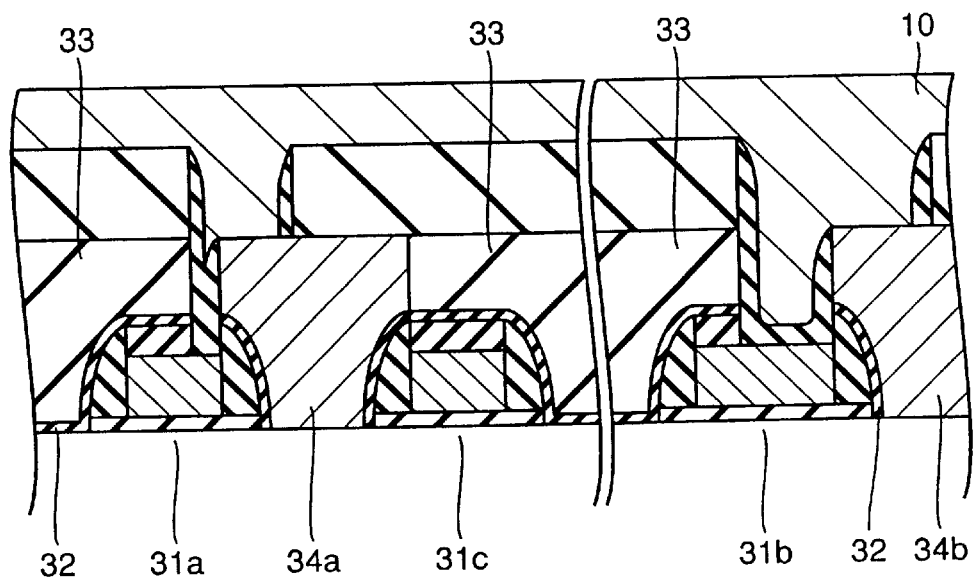
FIG. 15 is a sectional view showing another modification of the first and second embodiments.
Figure 16:
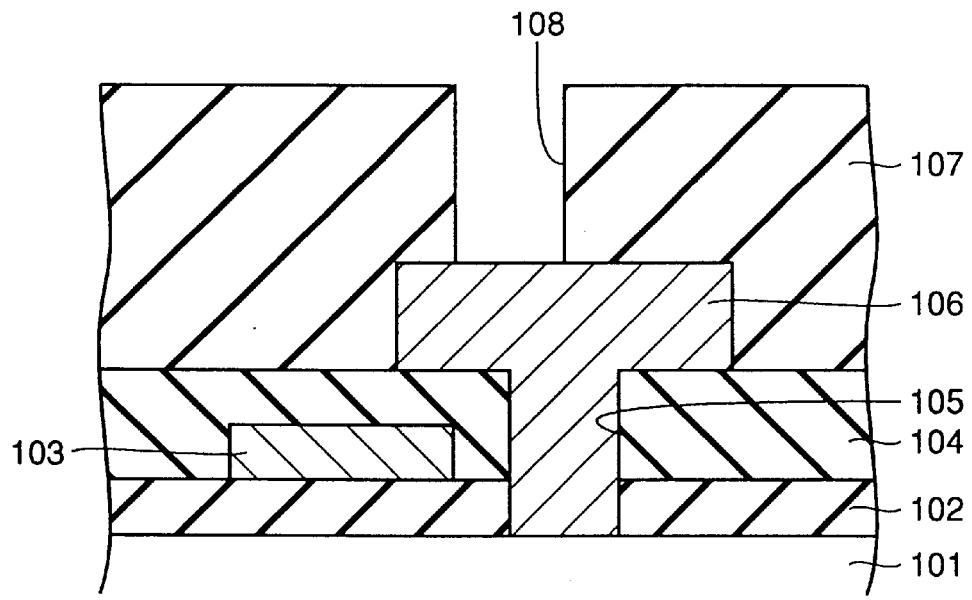
FIG. 16 is a sectional view showing a step in a conventional method of manufacturing a semiconductor device.
Figure 17:
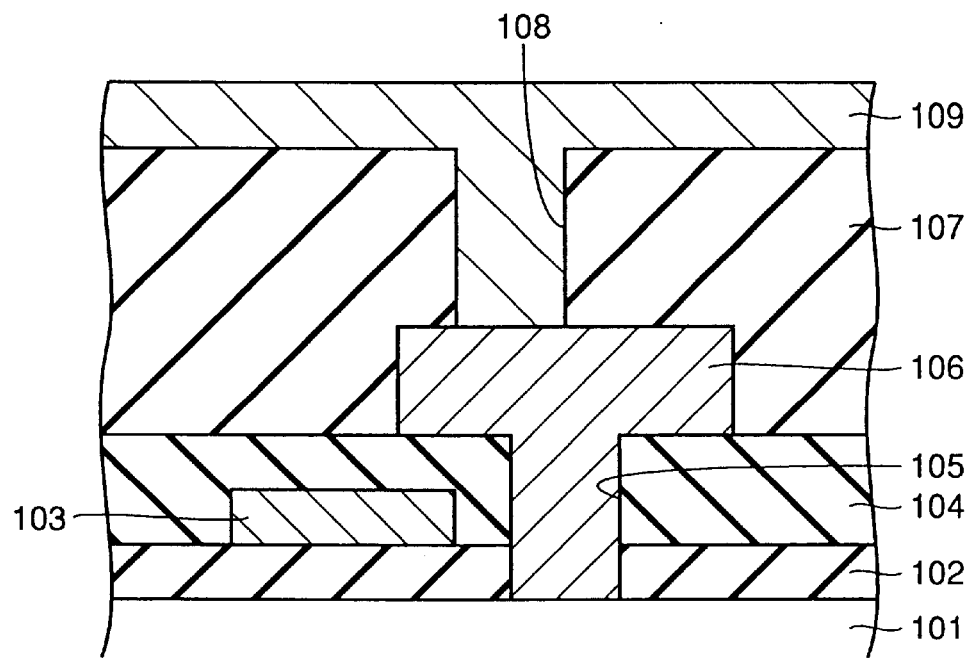
FIG. 17 is a sectional view showing a step carried out subsequently to the step shown in FIG. 16.
Figure 18:
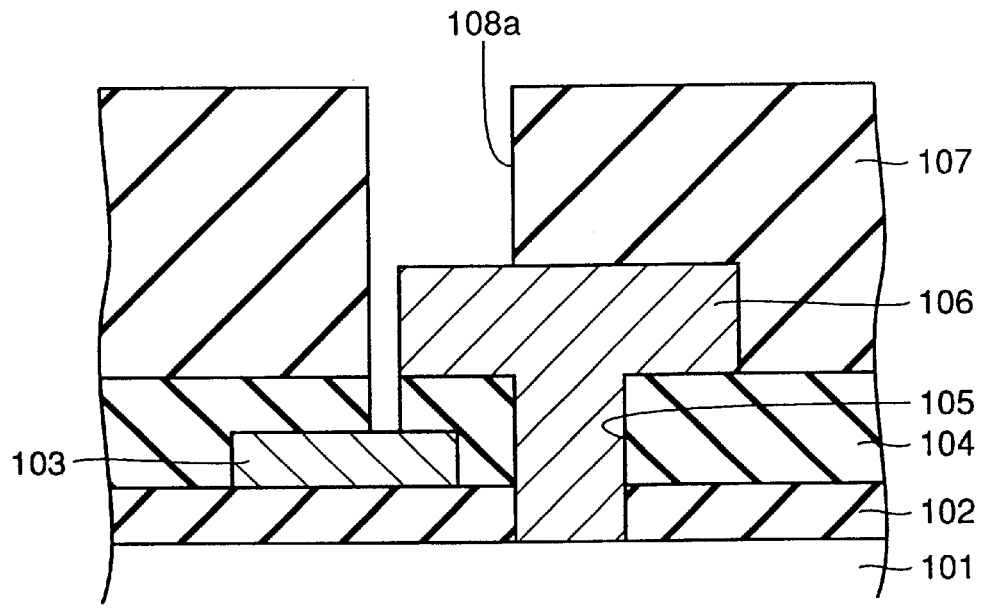
FIG. 18 is a sectional view showing a step for illustrating problems in the conventional method of manufacturing a semiconductor device.
Figure 19:
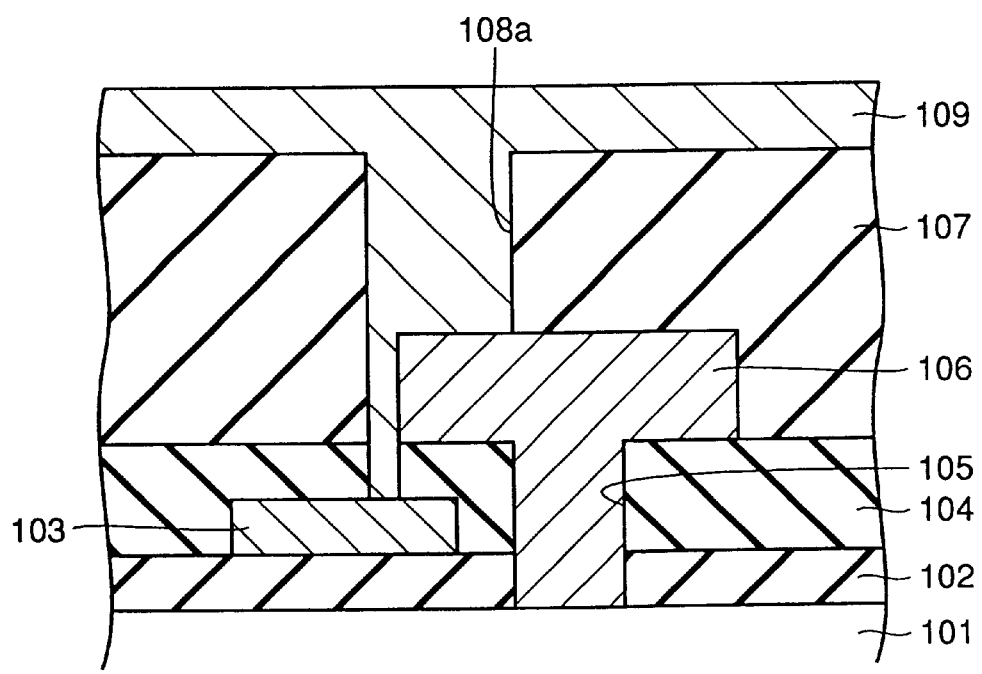
FIG. 19 is a sectional view showing a step carried out subsequently to the step shown in FIG. 18.

As shown in FIG. 15, pads 34a and 34b may be formed in a self-alignment manner. In this case, gate electrode parts 31a, 31b and 31c, for example, are formed as wires on a silicon substrate 1, for example. A silicon nitride film 32, for example, is formed to cover the gate electrode parts 31a, 31b and 31c. A silicon oxide film 33 different in etching property from the silicon nitride film 32 is formed on the silicon nitride film 32.

The pad 34a or the like is formed to be electrically connected with the part of the silicon substrate 1 located between the adjacent gate electrode parts 31a and 31c or the like. The pad 34a is formed in a self-alignment manner through the difference in etching rate between the silicon oxide film 33 and the silicon nitride film 32.

Thus, the semiconductor devices can attain further refinement by forming the pads 6a and 6b in a self-alignment manner.

In this case, the diameter of the pad 34a is about 0.2 $\mu$m, the diameter of a contact hole is about 0.12 $\mu$m, and the width of a gate wire is about 0.2 $\mu$m, for example. The distance between the pad 34a and the gate wire is 0.05 $\mu$m in a direction parallel to the surface of the silicon wafer, and 0.08 $\mu$m in a direction perpendicular to the surface of the silicon wafer.

While the contact hole is misaligned in each of the aforementioned embodiments, the present invention is also applicable to a contact hole not misaligned.

According to the present invention, the side wall oxide film is provided in the contact hole for preventing the conductive layer and the wire from being electrically shorted also when the contact hole is misaligned, so that the semiconductor device can readily attain refinement and high integration.

The aforementioned method of manufacturing a semiconductor device is not restricted to refinement and high integration of the semiconductor device but is widely applicable also as a method of repairing the semiconductor device when the contact hole is misaligned.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
    a first conductive region, having an upper surface, formed on the main surface of a semiconductor substrate;
    a second conductive region formed on the main surface of said semiconductor substrate spaced apart from said first conductive region and having an upper surface extending over the upper surface of said first conductive region;
    a first insulating film formed on the main surface of said semiconductor substrate over said first conductive region and said second conductive region;
    a contact hole, formed in said first insulating film, exposing the upper surface of said second conductive region;
    a second insulating film formed covering the side surface and the bottom surface of said contact hole except the exposed upper surface of said second conductive region; and
    a third conductive region formed on said first insulating film including a part located in said contact hole and electrically connected with said second conductive region.

2. The semiconductor device according to claim 1, wherein said second insulating film electrically insulates said third conductive region and said first conductive region from each other when said contact hole is formed to two-dimensionally overlap with said first conductive region and said second conductive region by misalignment.

3. The semiconductor device according to claim 1, wherein said contact hole is formed to two-dimensionally overlap with said first conductive region and said second conductive region, and
    a part located downward beyond the upper surface of said second conductive region is substantially filled up with at least said second insulating film in said contact hole.

4. The semiconductor device according to claim 3, wherein said part located downward beyond the upper surface of said second conductive region is further filled up with said third conductive region formed on said second insulating film in said contact hole.

5. The semiconductor device according to claim 1, having a plurality of said first conductive regions, wherein
    said first conductive regions are covered with a third insulating film, different in etching property from said first insulating film, formed between said first insulating film and said first conductive regions, and
    said second conductive region is formed between adjacent said first conductive regions covered with said third insulating film respectively.

6. The semiconductor device according to claim 2, having a plurality of said first conductive regions, wherein
    said first conductive regions are covered with a third insulating film, different in etching property from said first insulating film, formed between said first insulating film and said first conductive regions, and
    said second conductive region is formed between adjacent said first conductive regions covered with said third insulating film respectively.

7. The semiconductor device according to claim 3, having a plurality of said first conductive regions, wherein
    said first conductive regions are covered with a third insulating film, different in etching property from said first insulating film, formed between said first insulating film and said first conductive regions, and
    said second conductive region is formed between adjacent said first conductive regions covered with said third insulating film respectively.

8. The semiconductor device according to claim 4, having a plurality of said first conductive regions, wherein
    said first conductive regions are covered with a third insulating film, different in etching property from said first insulating film, formed between said first insulating film and said first conductive regions, and
    said second conductive region is formed between adjacent said first conductive regions covered with said third insulating film respectively.

* * * * *

UNITED STATES PATENT AND TRADEMARK OFFICE
CERTIFICATE OF CORRECTION

PATENT NO. : 6,483,192 B1
DATED : November 19, 2002
INVENTOR(S) : Heiji Kobayashi It is certified that error appears in the above-identified patent and that said Letters Patent is hereby corrected as shown below:

<u>Title page,</u>
Item [73], Assignee, after "Kabushiki" change "Kiahsa" to -- Kaisha --

Signed and Sealed this

Ninth Day of September, 2003

JAMES E. ROGAN
*Director of the United States Patent and Trademark Office*